United States Patent
Zhang et al.

(10) Patent No.: US 11,150,985 B2
(45) Date of Patent: Oct. 19, 2021

(54) DECODER FOR MEMORY SYSTEM AND METHOD THEREOF

(71) Applicant: SK hynix Inc., Gyeonggi-do (KR)

(72) Inventors: Fan Zhang, Fremont, CA (US);
Xuanxuan Lu, San Jose, CA (US)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/591,065

(22) Filed: Oct. 2, 2019

(65) Prior Publication Data

US 2021/0103494 A1 Apr. 8, 2021

(51) Int. Cl.
*G11C 29/00* (2006.01)
*G06F 11/10* (2006.01)
*H03M 13/15* (2006.01)

(52) U.S. Cl.
CPC ..... *G06F 11/1068* (2013.01); *H03M 13/1575* (2013.01)

(58) Field of Classification Search
CPC .................. G06F 11/1068; H03M 13/1575
See application file for complete search history.

(56) References Cited

U.S. PATENT DOCUMENTS

| | | | |
|---|---|---|---|
| 8,996,947 B2 | 3/2015 | Chung et al. | |
| 9,966,972 B1 | 5/2018 | Zhong et al. | |
| 2002/0172179 A1* | 11/2002 | Grimsrud | H04L 1/0041 370/342 |
| 2017/0329667 A1* | 11/2017 | Hirano | H03M 13/6566 |
| 2019/0371227 A1* | 12/2019 | Choi | G09G 5/005 |

* cited by examiner

*Primary Examiner* — Samir W Rizk
(74) *Attorney, Agent, or Firm* — IP&T Group LLP

(57) ABSTRACT

Decoders are provided for memory systems. A decoder includes a seed generator that generates seeds based on a physical address corresponding to a read request from a host; a descrambling module that receives a sequence from a storage area among, multiple storage areas, corresponding to the physical address, and descrambles the sequence using the seeds to generate multiple descrambled sequences; and a selector that selects one of descrambled sequences based on syndrome weight values of the descrambled sequences.

16 Claims, 14 Drawing Sheets

DECODER FOR MEMORY SYSTEM AND METHOD THEREOF

BACKGROUND

1. Field

Embodiments of the present disclosure relate to encoding and decoding schemes for a memory system.

2. Description of the Related Art

The computer environment paradigm has shifted to ubiquitous computing systems that can be used anytime and anywhere. As a result, the use of portable electronic devices such as mobile phones, digital cameras, and notebook computers has rapidly increased. These portable electronic devices generally use a memory system having memory device(s), that is, data storage device(s). The data storage device is used as a main memory device or an auxiliary memory device of the portable electronic devices.

Memory systems using memory devices provide excellent stability, durability, high information access speed, and low power consumption, since they have no moving parts. Examples of memory systems having such advantages include universal serial bus (USB) memory devices, memory cards having various interfaces such as a universal flash storage (UFS), and solid state drives (SSDs). Memory systems may use various kinds of encoder and decoder.

SUMMARY

Aspects of the present invention include a fast decoding scheme for guided scrambling in a memory system.

In one aspect, a memory system includes a memory device including a plurality of storage areas and a controller including a decoder. The decoder includes: a seed generator for generating a plurality of seeds based on a physical address corresponding to a read request from a host; a descrambling module for receiving a sequence from a storage area among the plurality of storage areas corresponding to the physical address, and descrambling the sequence using the plurality of seeds to generate a plurality of descrambled sequences; and a selector for selecting a descrambled sequence among the plurality of descrambled sequences based on a plurality of syndrome weight values corresponding to the plurality of descrambled sequences.

In another aspect, a method for operating a memory system includes a memory device including a plurality of storage areas. The method includes: generating a plurality of seeds based on a physical address corresponding to a read request from a host; descrambling a sequence from a storage area among the plurality of storage areas corresponding to the physical address, using the plurality of seeds to generate a plurality of descrambled sequences; and selecting a descrambled sequence among the plurality of descrambled sequences based on a plurality of syndrome weight values corresponding to the plurality of descrambled sequences.

Additional aspects of the present invention will become apparent from the following description.

DETAILED DESCRIPTION

Figure 1:
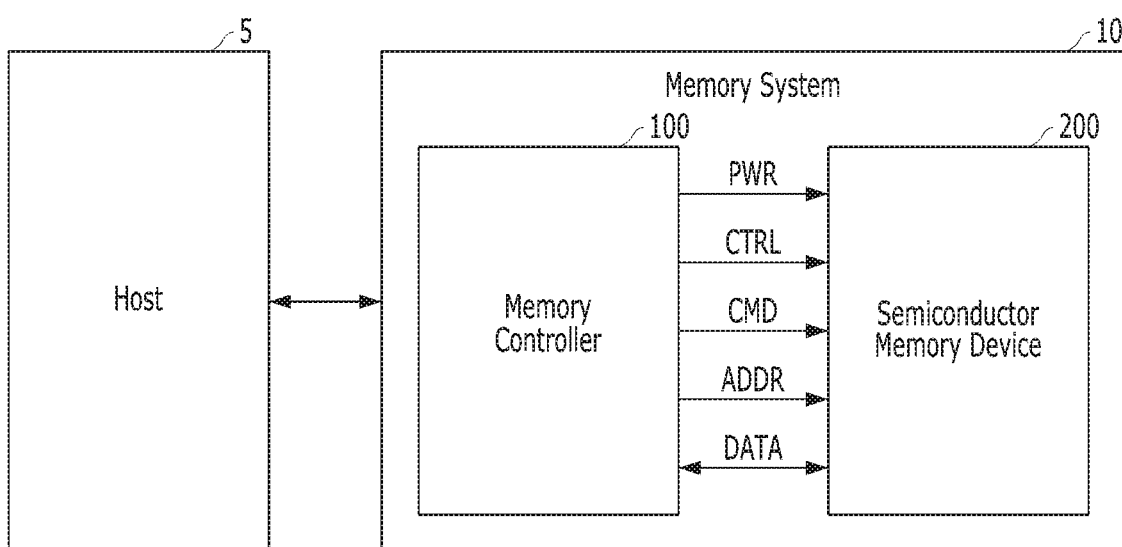
FIG. 1 is a block diagram illustrating a data processing system in accordance with an embodiment of the present invention.

Various embodiments are described below in more detail with reference to the accompanying drawings. The present invention may, however, be embodied in different forms and thus should not be construed as limited to the embodiments set forth herein. Rather, these embodiments are provided so that this disclosure is thorough and complete and fully conveys the scope of the present invention to those skilled in the art. Moreover, reference herein to "an embodiment," "another embodiment," or the like is not necessarily to only one embodiment, and different references to any such phrase are not necessarily to the same embodiment(s). Throughout the disclosure, like reference numerals refer to like parts in the figures and embodiments of the present invention.

The invention can be implemented in numerous ways, including as a process; an apparatus; a system; a computer program product embodied on a computer-readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily configured to perform the task at a given time or a specific component that is manufactured to perform the task. As used herein, the term 'processor' or the like refers to one or more devices, circuits, and/or processing cores suitable for processing data, such as computer program instructions.

A detailed description of embodiments of the invention is provided below along with accompanying figures that illustrate aspects of the invention. The invention is described in connection with such embodiments, but the invention is not limited to any embodiment. The scope of the invention is limited only by the claims. The invention encompasses numerous alternatives, modifications and equivalents within the scope of the claims. Numerous specific details are set forth in the following description in order to provide a thorough understanding of the invention. These details are provided for the purpose of example; the invention may be practiced according to the claims without some or all of these specific details. For clarity, technical material that is known in technical fields related to the invention has not been described in detail so that the invention is not unnecessarily obscured.

FIG. 1 is a block diagram illustrating a data processing system 2 in accordance with an embodiment of the present invention.

Referring FIG. 1, the data processing system 2 may include a host device 5 and a memory system 10. The memory system 10 may receive a request from the host device 5 and operate in response to the received request. For example, the memory system 10 may store data to be accessed by the host device 5.

The host device 5 may be implemented with any one of various kinds of electronic devices. In various embodiments, the host device 5 may include an electronic device such as a desktop computer, a workstation, a three-dimensional (3D) television, a smart television, a digital audio recorder, a digital audio player, a digital picture recorder, a digital picture player, and/or a digital video recorder and a digital video player. In various embodiments, the host device 5 may include a portable electronic device such as a mobile phone, a smart phone, an e-book, an MP3 player, a portable multimedia player (PMP), and/or a portable game player.

The memory system 10 may be implemented with any one of various kinds of storage devices such as a solid state drive (SSD) and a memory card. In various embodiments, the memory system 10 may be provided as one of various components in an electronic device such as a computer, an ultra-mobile personal computer (PC) (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, a radio-frequency identification (RFID) device, as well as one of various electronic devices of a home network, one of various electronic devices of a computer network, one of electronic devices of a telematics network, or one of various components of a computing system.

The memory system 10 may include a memory controller 100 and a semiconductor memory device 200. The memory controller 100 may control overall operations of the semiconductor memory device 200.

The semiconductor memory device 200 may perform one or more erase, program, and read operations under the control of the memory controller 100. The semiconductor memory device 200 may receive a command CMD, an address ADDR and data through input/output lines. The semiconductor memory device 200 may receive power PWR through a power line and a control signal CTRL through a control line. The control signal CTRL may include a command latch enable signal, an address latch enable signal, a chip enable signal, a write enable signal, a read enable signal, as well as other operational signals depending on design and configuration of the memory system 10.

The memory controller 100 and the semiconductor memory device 200 may be integrated in a single semiconductor device such as a solid state drive (SSD). The SSD may include a storage device for storing data therein. When the semiconductor memory system 10 is used in an SSD, operation speed of a host device (e.g., host device 5 of FIG. 1) coupled to the memory system 10 may remarkably improve.

The memory controller 100 and the semiconductor memory device 200 may be integrated in a single semiconductor device such as a memory card. For example, the memory controller 100 and the semiconductor memory device 200 may be so integrated to configure a personal computer (PC) card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and/or a universal flash storage (UFS).

Figure 2:
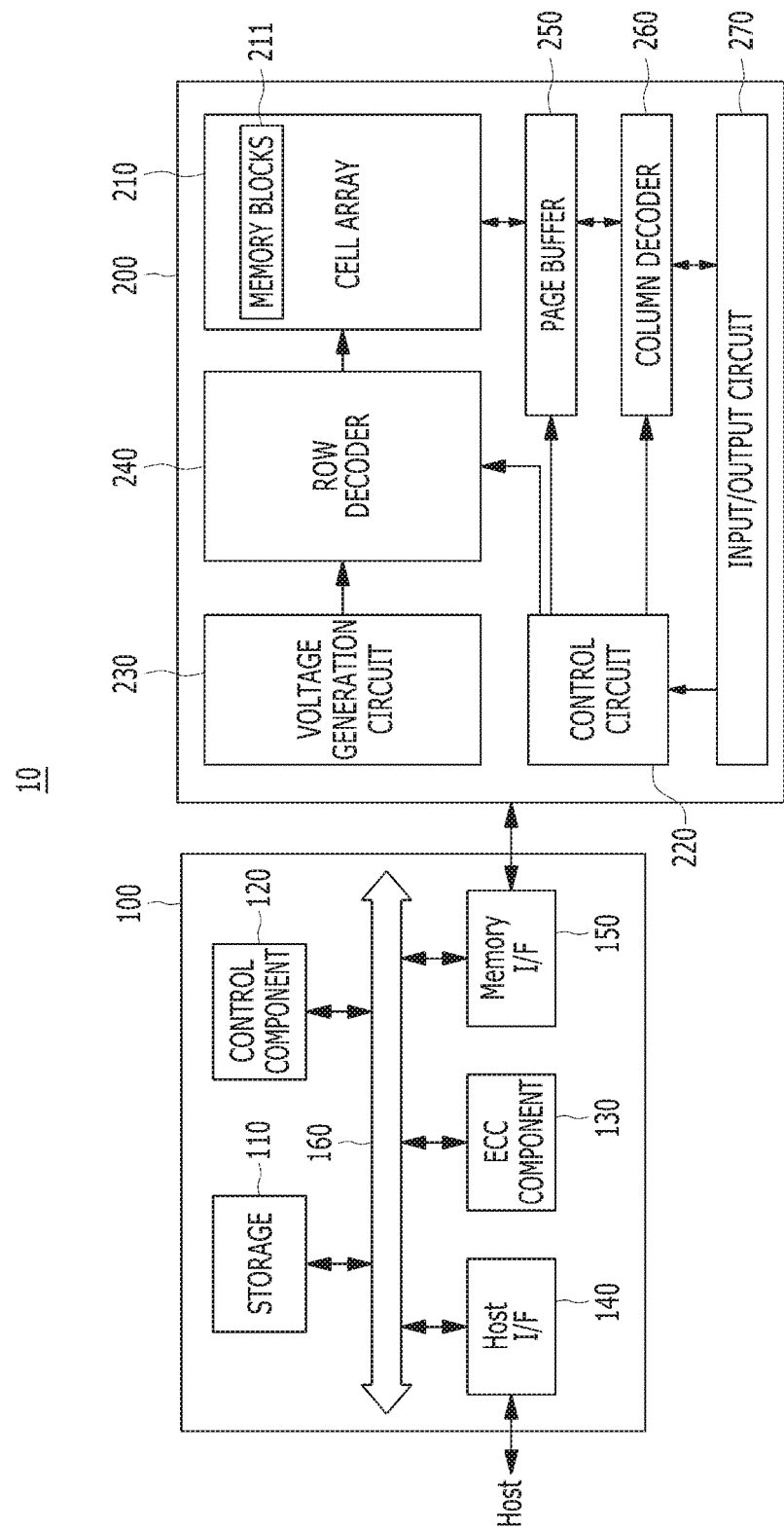
FIG. 2 is a block diagram illustrating a memory system in accordance with an embodiment of the present invention.

FIG. 2 is a block diagram illustrating a memory system in accordance with an embodiment of the present invention. For example, the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from a host device (e.g., host device 5 of FIG. 1), and in particular, store data to be accessed by the host device.

The memory device 200 may store data to be accessed by the host device.

The memory device 200 may be implemented with a volatile memory device such as a dynamic random access memory (DRAM) and/or a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM), and/or a resistive RAM (RRAM).

The controller 100 may control storage of data in the memory device 200. For example, the controller 100 may control the memory device 200 in response to a request from the host device. The controller 100 may provide data read from the memory device 200 to the host device, and may store data provided from the host device into the memory device 200.

The controller 100 may include a storage 110, a control component 120, which may be implemented as a processor such as a central processing unit (CPU), an error correction code (ECC) component 130, a host interface (I/F) 140 and a memory interface (I/F) 150, which are coupled through a bus 160.

The storage 110 may serve as a working memory of the memory system 10 and the controller 100, and store data for driving the memory system 10 and the controller 100. When the controller 100 controls operations of the memory device 200, the storage 110 may store data used by the controller 100 and the memory device 200 for such operations as read, write, program and erase operations.

The storage 110 may be implemented with a volatile memory such as a static random access memory (SRAM) or a dynamic random access memory (DRAM). As described above, the storage 110 may store data used by the host device in the memory device 200 for the read and write operations. To store the data, the storage 110 may include a program memory, a data memory, a write buffer, a read buffer, a map buffer, and the like.

The control component 120 may control general operations of the memory system 10, and a write operation or a read operation for the memory device 200, in response to a write request or a read request from the host device. The control component 120 may drive firmware, which is referred to as a flash translation layer (FTL), to control general operations of the memory system 10. For example, the FTL may perform operations such as logical-to-physical (L2P) mapping, wear leveling, garbage collection, and/or bad block handling. The L2P mapping is known as logical block addressing (LBA).

The ECC component 130 may detect and correct errors in the data read from the memory device 200 during the read operation. The ECC component 130 may not correct error bits when the number of the error bits is greater than or equal to a threshold number of correctable error bits, and instead may output an error correction fail signal indicating failure in correcting the error bits.

In various embodiments, the ECC component 130 may perform an error correction operation based on a coded modulation such as a low density parity check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), or a Block coded modulation (BCM). However, error correction is not limited to these techniques. As such, the ECC component 130 may include any and all circuits, systems or devices for suitable error correction operation.

The host interface 140 may communicate with the host device through one or more of various interface protocols such as a universal serial bus (USB), a multi-media card (MMC), a peripheral component interconnect express (PCI-e or PCIe), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the control component 120. When the memory device 200 is a flash memory such as a NAND flash memory, the memory interface 150 may generate control signals for the memory and process data under the control of the control component 120.

The memory device 200 may include a memory cell array 210, a control circuit 220, a voltage generation circuit 230, a row decoder 240, a page buffer 250, which may be in the form of an array of page buffers, a column decoder 260, and an input and output (input/output) circuit 270. The memory cell array 210 may include a plurality of memory blocks 211 which may store data. The voltage generation circuit 230, the row decoder 240, the page buffer array 250, the column decoder 260 and the input/output circuit 270 may form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages of various levels. For example, in an erase operation, the voltage generation circuit 230 may generate operation voltages of various levels such as an erase voltage and a pass voltage.

The row decoder 240 may be in electrical communication with the voltage generation circuit 230, and the plurality of memory blocks 211. The row decoder 240 may select at least one memory block among the plurality of memory blocks 211 in response to a row address generated by the control circuit 220, and transmit operation voltages supplied from the voltage generation circuit 230 to the selected memory blocks.

Figure 3:
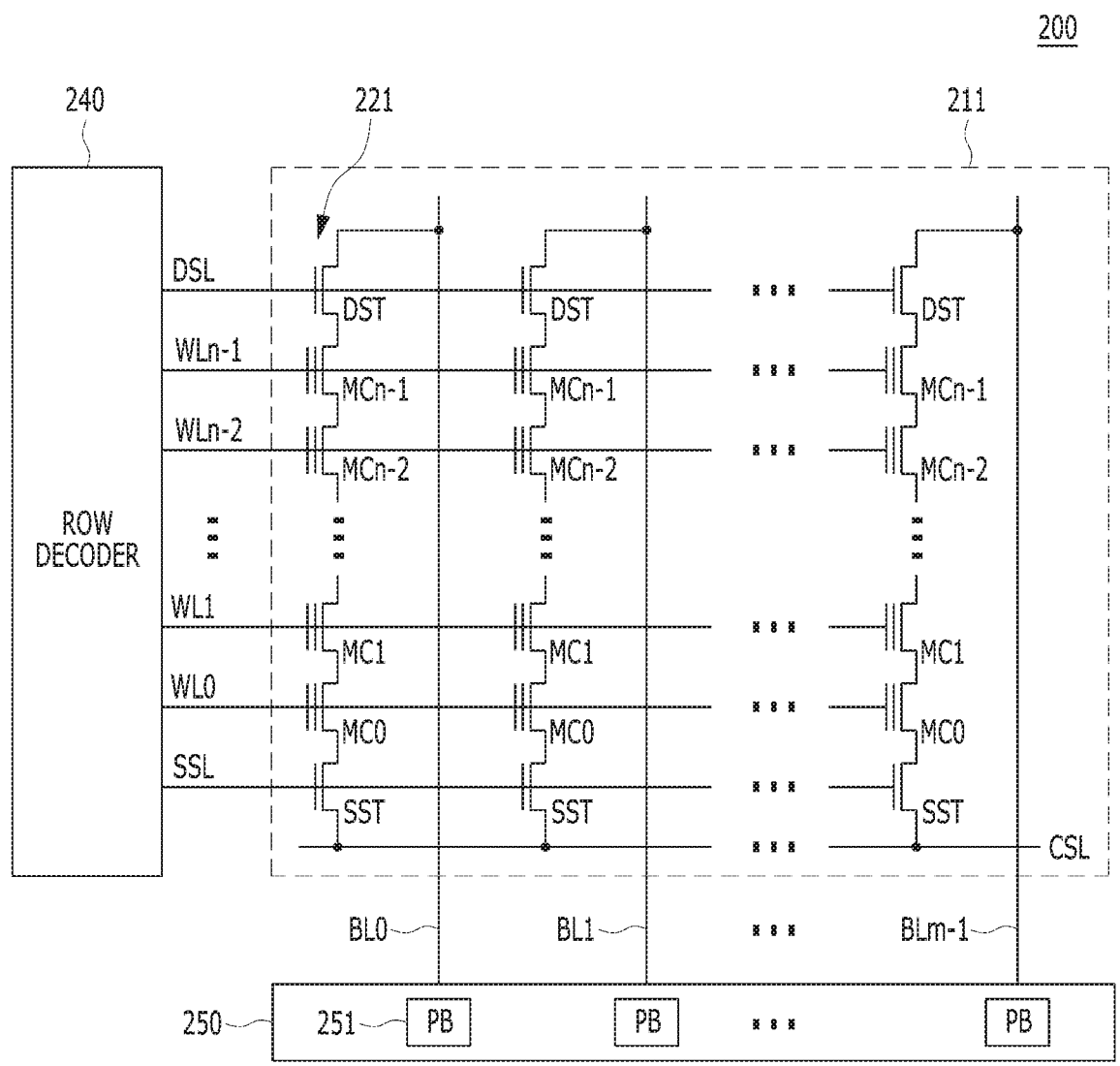
FIG. 3 is a circuit diagram illustrating a memory block of a memory device in accordance with an embodiment of the present invention.

The page buffer 250 may be coupled with the memory cell array 210 through bit lines BL (shown in FIG. 3). The page buffer 250 may precharge the bit lines BL with a positive voltage, transmit data to, and receive data from, a selected memory block in program and read operations, or temporarily store transmitted data, in response to page buffer control signal(s) generated by the control circuit 220.

The column decoder 260 may transmit data to, and receive data from, the page buffer 250 or transmit and receive data to and from the input/output circuit 270.

The input/output circuit 270 may transmit to the control circuit 220 a command and an address, received from an external device (e.g., the memory controller 100 of FIG. 1), transmit data from the external device to the column decoder 260, or output data from the column decoder 260 to the external device, through the input/output circuit 270.

The control circuit 220 may control the peripheral circuit in response to the command and the address.

FIG. 3 is a circuit diagram illustrating a memory block of a semiconductor memory device in accordance with an embodiment of the present invention. For example, the memory block of FIG. 3 may be any of the memory blocks 211 of the memory cell array 210 shown in FIG. 2.

Referring to FIG. 3, the exemplary memory block 211 may include a plurality of word lines WL0 to WLn-1, a drain select line DSL and a source select line SSL coupled to the row decoder 240. These lines may be arranged in parallel, with the plurality of word lines between the DSL and SSL.

The exemplary memory block 211 may further include a plurality of cell strings 221 respectively coupled to bit lines BL0 to BLm-1. The cell string of each column may include one or more drain selection transistors DST and one or more source selection transistors SST. In the illustrated embodiment, each cell string has one DST and one SST. In a cell string, a plurality of memory cells or memory cell transistors MC0 to MCn-1 may be serially coupled between the selection transistors DST and SST. Each of the memory cells may be formed as a multiple level cell. For example, each of the memory cells may be formed as a single level cell (SLC) storing 1 bit of data. Each of the memory cells may be formed as a multi-level cell (MLC) storing 2 bits of data. Each of the memory cells may be formed as a triple-level cell (TLC) storing 3 bits of data. Each of the memory cells may be formed as a quadruple-level cell (QLC) storing 4 bits of data.

The source of the SST in each cell string may be coupled to a common source line CSL, and the drain of each DST may be coupled to the corresponding bit line. Gates of the SSTs in the cell strings may be coupled to the SSL, and gates of the DSTs in the cell strings may be coupled to the DSL. Gates of the memory cells across the cell strings may be coupled to respective word lines. That is, the gates of memory cells MC0 are coupled to corresponding word line WL0, the gates of memory cells MC1 are coupled to corresponding word line WL1, etc. The group of memory cells coupled to a particular word line may be referred to as a physical page. Therefore, the number of physical pages in the memory block 211 may correspond to the number of word lines.

The page buffer array 250 may include a plurality of page buffers 251 that are coupled to the bit lines BL0 to BLm−1. The page buffers 251 may operate in response to page buffer control signals. For example, the page buffers 251 may temporarily store data received through the bit lines BL0 to BLm−1 or sense voltages or currents of the bit lines during a read or verify operation.

In some embodiments, the memory blocks 211 may include a NAND-type flash memory cell. However, the memory blocks 211 are not limited to such cell type, but may include NOR-type flash memory cell(s). Memory cell array 210 may be implemented as a hybrid flash memory in which two or more types of memory cells are combined, or one-NAND flash memory in which a controller is embedded inside a memory chip.

In some embodiments, the memory blocks 211 may include a NAND-type flash memory cell. However, the memory blocks 211 are not limited to such cell type, but may include NOR-type flash memory cell(s). Memory cell array 210 may be implemented as a hybrid flash memory in which two or more types of memory cells are combined, or one-NAND flash memory in which a controller is embedded inside a memory chip.

A memory device such as a flash memory (e.g., NAND flash memory) may include a plurality of memory blocks (e.g., hundreds to thousands of memory blocks). Each block typically may include a plurality of wordlines (e.g., hundreds of wordlines). Each cell coupled to each wordline may include multiple logical pages. The memory device may include a plurality of memory cells and store multiple bits per cell by modulating the cell into different states or program voltage (PV) levels through a programming operation.

Figure 4:
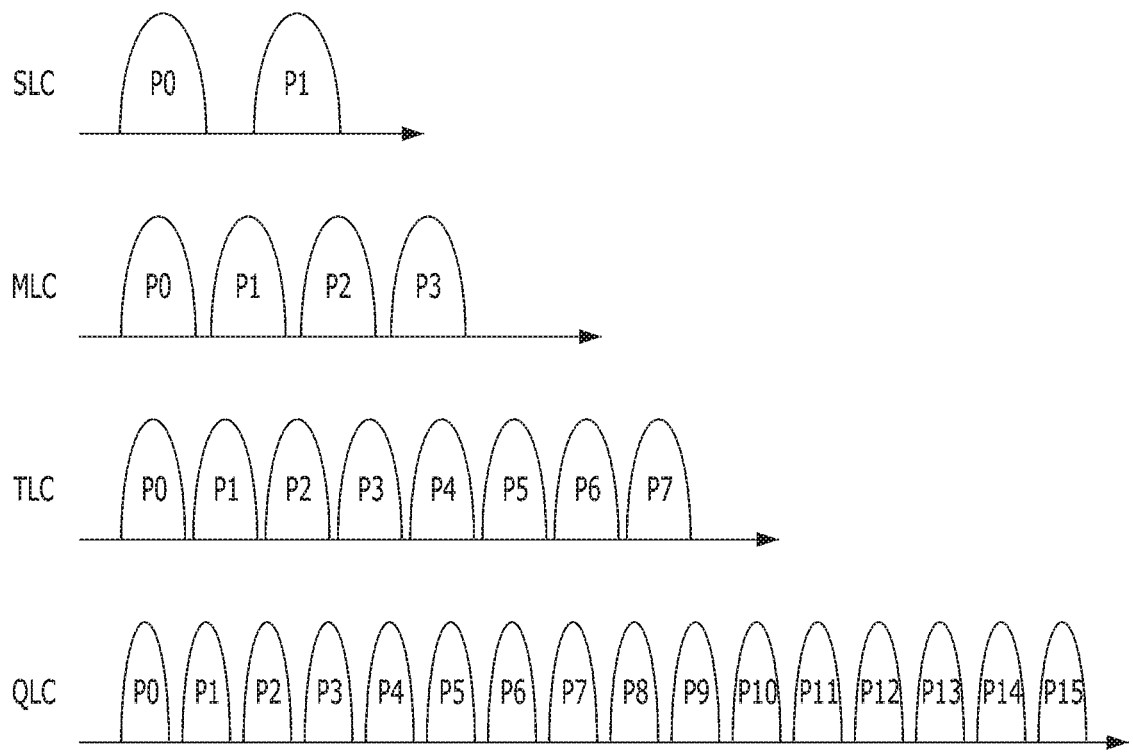
FIG. 4 is a diagram illustrating distributions of states for cells of a memory device.

FIG. 4 is a diagram illustrating distributions of states or program voltage (PV) levels for different types of cells of a memory device.

Referring to FIG. 4, each of memory cells may be implemented with multiple level cells, for example, a single level cell (SLC) storing 1 bit of data, a multi-level cell (MLC) storing 2 bits of data, a triple-level cell (TLC) storing 3 bits of data, or a quadruple-level cell (QLC) storing 4 bits of data.

SLCs may include two states P0 and P1. P0 may indicate an erase state, and P1 may indicate a program state. Since the SLC can be set in one of two different states, each SLC may program or store 1 bit according to a set coding method. MLCs may include four states P0, P1, P2 and P3. Among these states, P0 may indicate an erase state, and P1 to P3 may indicate program states. Since the MLC can be set in one of four different states, each MLC may program or store two bits according to a set coding method. TLCs may include eight states P0 to P7. Among these states, P0 may indicate an erase state, and P1 to P7 may indicate program states. Since the TLC can be set in one of eight different states, each TLC may program or store three bits according to a set coding method. QLCs may include 16 states P0 to P15. Among these states, P0 may indicate an erase state, and P1 to P15 may indicate program states. Since the QLC can be set in one of sixteen different states, each QLC may program or store four bits according to a set coding method.

Figure 5A:
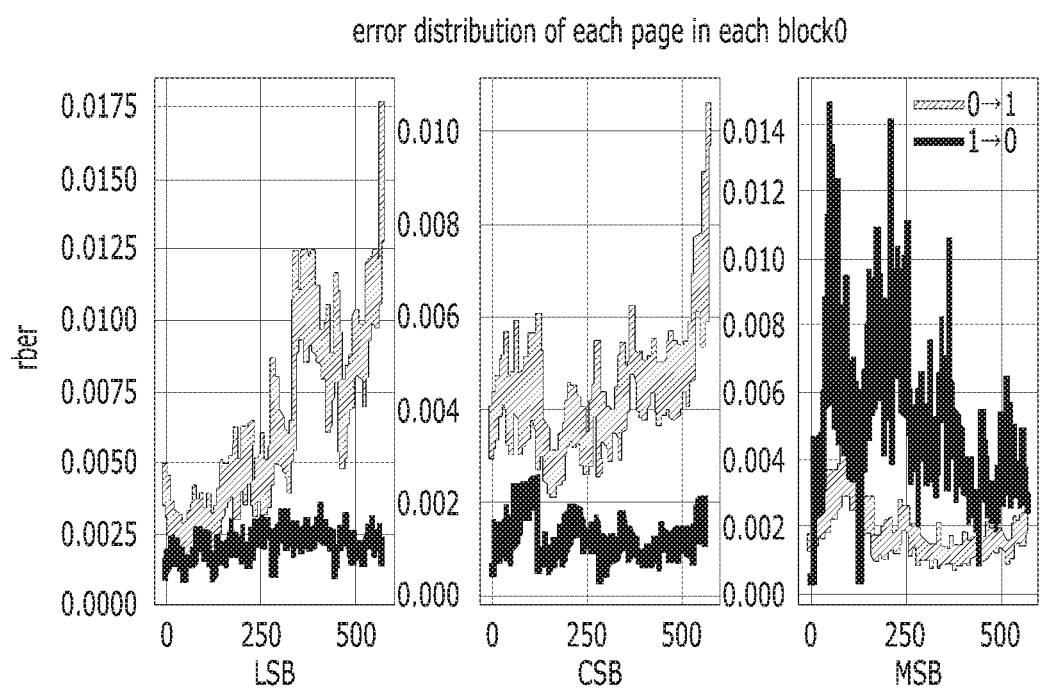
FIGS. 5A and 5B are diagrams illustrating distributions of bit error rates for different pages of different blocks in a memory device.
Figure 5B:
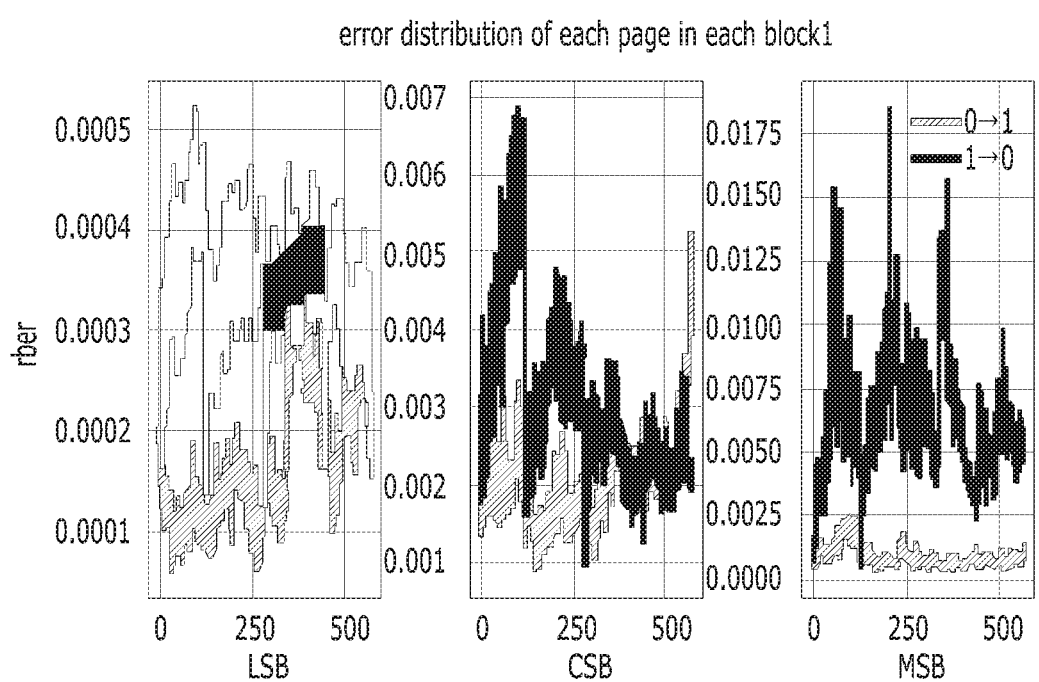

As such, for a memory device including TLCs, there are 8 states or PV levels and each level corresponds to a unique 3-bit tuple. First, second and third bits of cells are grouped together into a least significant bit (LSB) page, a center significant bit (CSB) page and a most significant bit (MSB) page, respectively. The different PV levels usually have different noise variances, and hence cause a probability of $1 \to 0$ errors (i.e., $p_{1 \to 0}$) to be different than a probability of $0 \to 1$ errors (i.e., $p_{0 \to 1}$) for each logical page, each word-line and each block, as shown in FIGS. 5A and 5B. $p_{1 \to 0}$ may represent bit error rate when a bit having a logical high value (i.e., bit-1) is stored in a corresponding page, and $p_{0 \to 1}$ may represent bit error rate when a bit having a logical low value (i.e., bit-0) is stored in a corresponding page. $p_{1 \to 0}$ may occur when bit-1 is incorrectly read as bit-0, and $p_{0 \to 1}$ may occur when bit-0 is incorrectly read as bit-1.

FIGS. 5A and 5B are diagrams illustrating distributions of bit error rates for different logical pages of different blocks in a memory device, for example, a triple-level cell (TLC) NAND-type flash memory device.

In FIGS. 5A and 5B, the x-axis represents logical pages LSB, CSB or MSB and the y-axis represents raw bit error rates (or an error probability). In FIG. 5A, for each of logical pages LSB, CSB or MSB of a block 0, $p_{0 \to 1}$ is different from $p_{1 \to 0}$. In FIG. 5B, for each of logical pages LSB, CSB or MSB of a block 1, $p_{0 \to 1}$ is different from $p_{1 \to 0}$. In addition, for the same logical pages LSB, CSB or MSB, $p_{0 \to 1}$ of the block 0 is different from $p_{0 \to 1}$ of the block 1 and $p_{1 \to 0}$ of the block 0 is different from $p_{1 \to 0}$ of the block 1. In other words, the error probability may depend on stored bit value ("0" or "1") and its position (or storage area) of TLC NAND-type flash memory device. The position may be any of a logical page, a wordline and a block regarding data to be stored in the memory device.

Thus, it is necessary to provide a scheme in order to reduce bit error rates in a memory device such as TLC NAND-type flash memory device.

Figure 6:
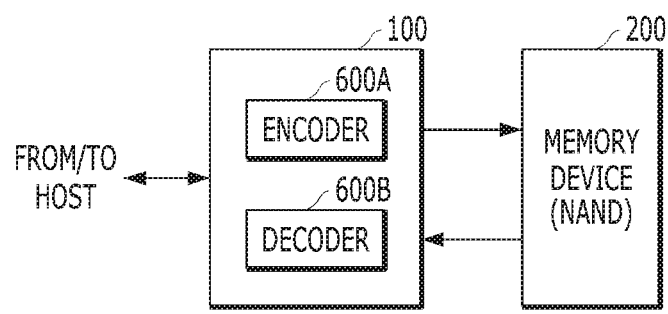
FIG. 6 is a diagram illustrating a memory system in accordance with an embodiment of the present invention.

FIG. 6 is a diagram illustrating a memory system in accordance with an embodiment of the present invention.

Referring to FIG. 6, the memory system may include a controller 100 and a memory device 200. The memory device 200 may include a NAND-type flash memory device with memory cells such as single-level cells (SLCs), multi-level cells (MLCs), triple-level cells (TLCs) or quadruple-level cells (QLCs). In various embodiments, the memory device 200 may include a NAND-type flash memory device with QLC memory cells (i.e., QLCs).

The controller 100 may receive a command from a host, and provide the memory device 200 with the received command. For example, the controller 100 receives a write command and write data corresponding to the write command, and controls the memory device 200 to perform a program operation on the write data. For another example, the controller 100 receives a read command, and controls the memory device 200 to perform a read operation on data corresponding to the read command. The controller 100 transmits read data corresponding to the read command to the host.

The controller 100 may include an encoder 600A, and a decoder 600B. During the program operation, the encoder 600A may perform an encoding operation on the write data based on a set encoding scheme. During the read operation, the decoder 600B may perform a decoding operation on the read data based on a set decoding scheme corresponding to the encoding scheme. The encoding schemes will be described below with reference to FIGS. 7A to 9. The decoding schemes will be described below with reference to FIGS. 10 to 14. The controller 100 and the memory device 200 may perform the operations described in FIGS. 1 and 2. In an embodiment, the encoder 600A and decoder 600B may be embodied in the ECC component 130 of the controller 100 shown in FIG. 2. Other suitable arrangements may be employed as well, as explained below. In general, the encoder 600A and decoder 600B may be implemented by hardware, software, firmware, or any suitable combination thereof.

In various embodiments, the encoder 600A may perform encoding operations using multiple scrambling (i.e., guided scrambling) before a program operation, in order to reduce bit error rates in the memory device 200 such as TLC NAND-type flash memory device. That is, the encoder 600A may function as a guided scrambling encoder. The decoder 600B may perform decoding operations using multiple descrambling, corresponding to encoding operations of the encoder 600A.

Figure 7A:
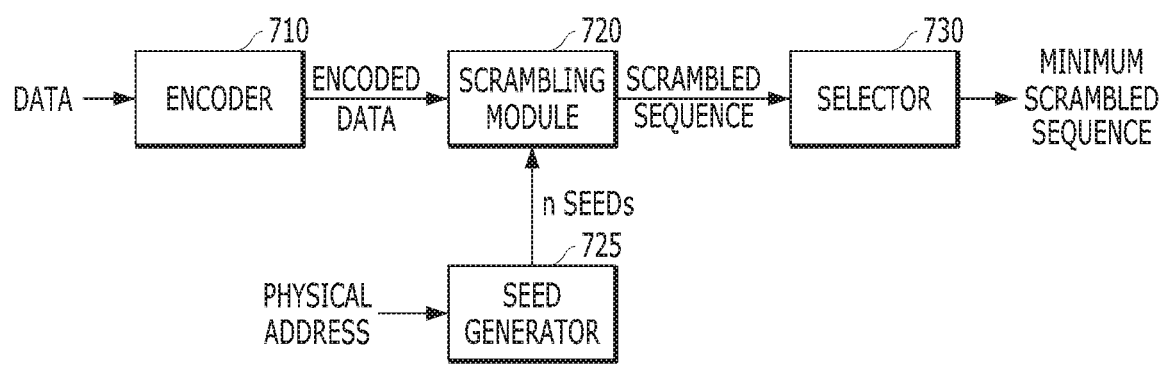
FIG. 7A is a diagram illustrating an encoder in accordance with an embodiment of the present invention.

FIG. 7A is a diagram illustrating an encoder in accordance with an embodiment of the present invention. For example, the encoder of FIG. 7A may depict the encoder 600A shown in FIG. 6.

Referring to FIG. 7A, the encoder may include an encoder module 710, a scrambling module 720, a seed generator 725 and a selector 730. The encoder module 710 may receive data (e.g., user data) from a host, encode the data and output the encoded data. In various embodiments, the encoder module 710 may encode the data using a low density parity check (LDPC) code.

The seed generator 725 may receive information regarding a physical address corresponding to the received data, and generate a plurality of seeds (e.g., n seeds). For example, n may be 8 or 16. In various embodiments, the information may indicate the physical address of a storage area among a plurality of storage areas of a memory device (e.g., memory device 200 of FIG. 6) in which the data is to be stored. For example, the information may include information regarding a block, a wordline and/or a logical page associated with the storage area (e.g., a block index, a wordline index and a logical page index).

The scrambling module 720 may receive the encoded data and scramble the encoded data using the plurality of seeds to generate a plurality of scrambled sequences.

Figure 7B:
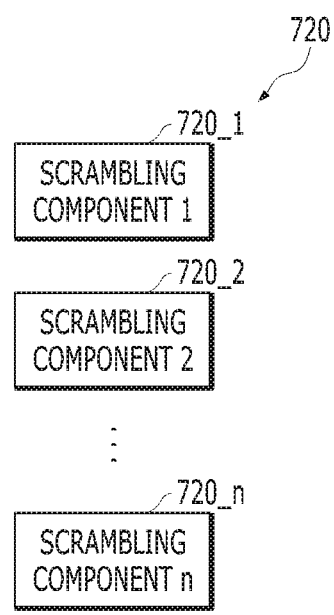
FIG. 7B is a diagram illustrating a scrambling module in accordance with an embodiment of the present invention.

FIG. 7B is a diagram illustrating a scrambling module in accordance with an embodiment of the present invention. For example, the scrambling module of FIG. 7B may depict the scrambling module 720 shown in FIG. 7A.

Referring to FIG. 7B, the scrambling module 720 may include a plurality of scrambling components, for example, a first scrambling component 720_1, a second scrambling component 720_2 and an nth scrambling component 720_n.

Figure 8:
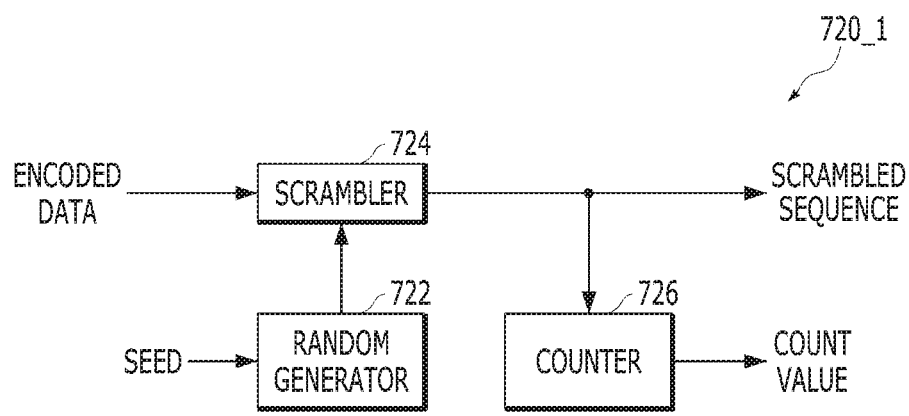
FIG. 8 is a diagram illustrating a scrambling component in accordance with an embodiment of the present invention.

FIG. 8 is a diagram illustrating a scrambling component in accordance with an embodiment of the present invention. For example, the scrambling component of FIG. 8 may depict one of the scrambling components 720_1 to 720_n shown in FIG. 7B.

Referring to FIG. 8, a representative scrambling component 720_1, among the scrambling components 720_1 to 7210_n, may include a random generator 722, a scrambler 724 and a counter 726. The random generator 722 may generate a random sequence based on a seed. In various embodiments, the random generator 722 may generate a pseudo random sequence. The scrambler 724 may scramble the data to generate a scrambled sequence, using the random sequence. In various embodiments, the scrambler 724 may scramble the data by performing an XOR operation on the data with the random sequence. The counter 726 may count the number of occurrences of a certain logical value ("0" or "1") in the scrambled sequence to generate a counted value for output.

Referring back to FIG. 7A, the selector 730 may receive the plurality of scrambled sequences and select a scrambled sequence among the plurality of scrambled sequences. In various embodiments, the selector 730 may select a scrambled sequence having the lowest number of logical high values "1's" or logical low values "0's", either of which represents a minimum scrambled sequence among the plurality of scrambled sequences. The selector 730 may provide a memory device (e.g., the memory device 200 of FIG. 6) with the selected scrambled sequence to be stored in a corresponding storage area of the memory device 200.

As described above, in the encoder 600A in a write path of the memory system, data (e.g., user data) is first encoded by the encoder module 710 such as the LDPC encoder as the following: c=E(u), where u represents user data and c represents encoded data.

Second, the encoded data is scrambled by n different scrambling components 720_1 to 720_n of the scrambling module 720 using n different seeds as follows: $s_i=S_i(c)$, where s represents a scrambled sequence using n different seeds (i=1, 2, . . . , n). To get sufficient reduction of number of 1's, n may be chosen as 8 or 16. It is noted that the seeds are generated in a pseudo-random way based on the physical address of the data so that it is unnecessary to store the seeds.

Figure 9:
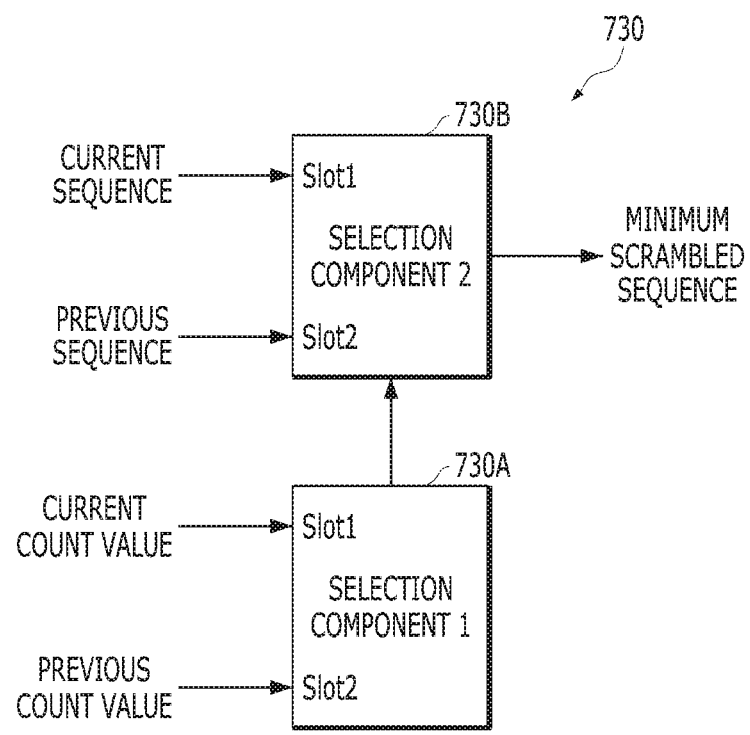
FIG. 9 is a diagram illustrating a selector in accordance with an embodiment of the present invention.

Third, the scrambled sequence having least number of 1's, i.e., the minimum scrambled sequence is selected among n scrambled sequences. In various embodiments, to save the memory required to implement the write path, the selector 730 may have a first selection component 730A and a second selection component 730B, each of which has 2 slots instead of n slots to receive n scrambled sequences or n count values from n scrambling components 720_1 to 720_n, as shown in FIG. 9. One slot (Slot1) of the first selection component 730A may be used to store a current count value, whereas the other slot (Slot2) of the first selection component 730A may be used to keep the winner of all previous count values. One slot (Slot1) of the second selection component 730B may be used to store a current sequence, whereas the other slot (Slot2) of the second selection component 730B may be used to keep the winner of all previous sequences, i.e., the minimum scrambled sequence among all previous sequences.

Finally, the selected scrambled sequence is written to the memory device 200 (e.g., NAND-type flash memory).

Conversely, to implement a read path of the memory system, the decoder 600B has to try all different descramblers (e.g., (8 or 16), one of which will give correct decoding results. This will cause extra latency (8× or 16×) or extra area (8× or 16×) when the same descramblers are used. Accordingly, it is desirable to provide a scheme to pick the correct descrambler without extra latency or area overhead. In various embodiments, the decoder 600B calculates the syndrome weights and then use the syndrome weights to select the correct descrambler.

Figure 10:
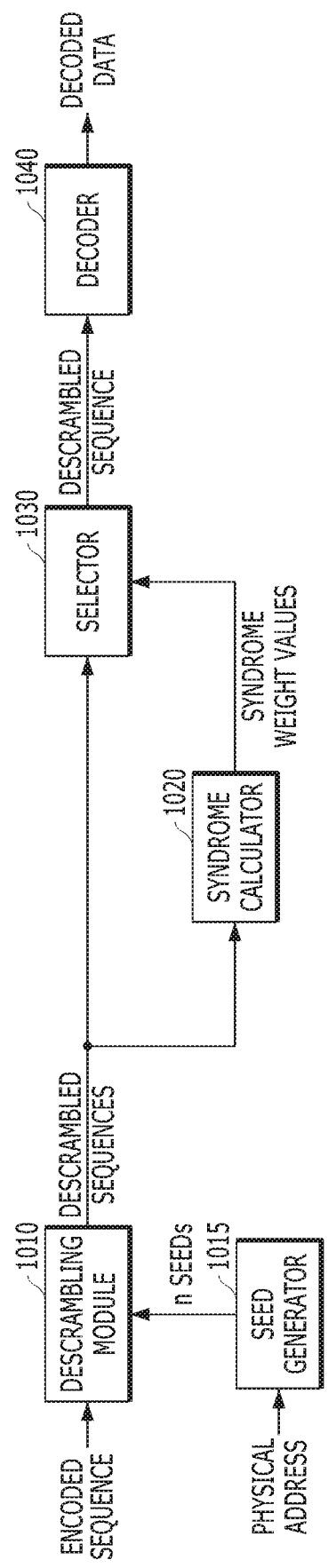
FIG. 10 is a diagram illustrating a decoder in accordance with an embodiment of the present invention.

FIG. 10 is a diagram illustrating a decoder in accordance with an embodiment of the present invention. For example, the decoder of FIG. 10 may depict the decoder 600E shown in FIG. 6.

Referring to FIG. 10, the decoder may include a descrambling module 1010, a seed generator 1015, a syndrome calculator 1020, a selector 1030 and a decoder 1040. The seed generator 1015 may generate a plurality of seeds (e.g., n seeds) based on a physical address corresponding to a read request from a host. The physical address may indicate a storage area among the plurality of storage areas in a memory device (e.g., the memory device 200 of FIG. 6).

The descrambling module 1010 may receive a sequence (e.g., an encoded sequence) from the storage area corresponding to the physical address, and descramble the sequence using the plurality of seeds to generate a plurality of descrambled sequences.

Figure 11A:
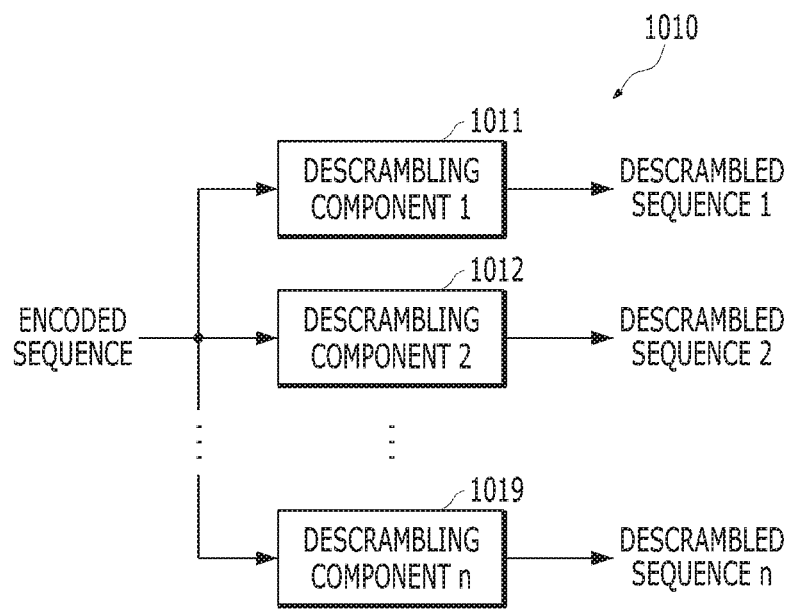
FIG. 11A is a diagram illustrating a descrambling module in accordance with an embodiment of the present invention.

FIG. 11A is a diagram illustrating a descrambling module 1010 in accordance with an embodiment of the present invention. For example, the descrambling module of FIG. 11A may depict the descrambling module 1010 shown in FIG. 10.

Referring to FIG. 11A, the descrambling module 1010 may include a plurality of descrambling components 1011 to 1019 corresponding to n seeds. Each of the plurality of descrambling components 1011 to 1019 may receive the encoded sequence and descramble the encoded sequence using a corresponding seed among the plurality of seeds to generate a corresponding descrambled sequence. In other words, the first descrambling component 1011 may descramble the encoded sequence using corresponding seed 1 to generate a first descrambled sequence. The second descrambling component 1012 may descramble the encoded sequence using corresponding seed 2 to generate a second descrambled sequence. The nth descrambling component 1019 may descramble the encoded sequence using corresponding seed n to generate a nth descrambled sequence.

Figure 11B:
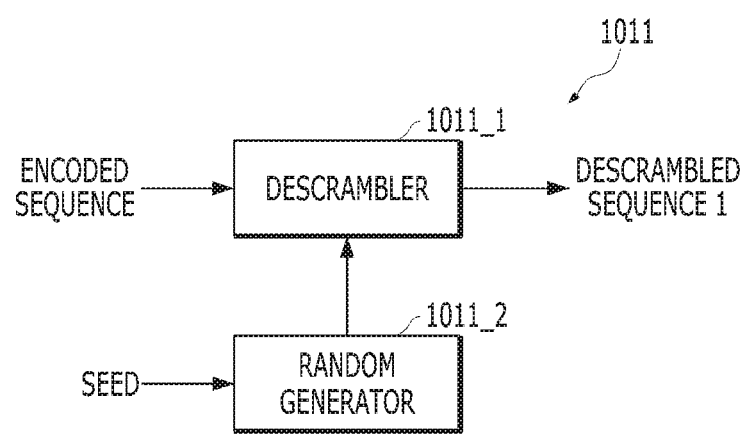
FIG. 11B is a diagram illustrating a descrambling component in accordance with an embodiment of the present invention.

FIG. 11B is a diagram illustrating a descrambling component 1011 in accordance with an embodiment of the present invention. For example, the descrambling component of FIG. 11B may depict one of the descrambling components 1011 to 1019 shown in FIG. 11B.

Referring to FIG. 11B, a representative descrambling component 1011, among the descrambling components 1011 to 1019, may include a descrambler 1011_1 and a random generator 1011_2. The random generator 1011_2 may generate a random number based on a corresponding seed (e.g., seed 1) among the plurality of seeds. The descrambler 1011_1 may receive the encoded sequence and descramble the encoded sequence using the random number to generate the first descrambled sequence.

Figure 12:
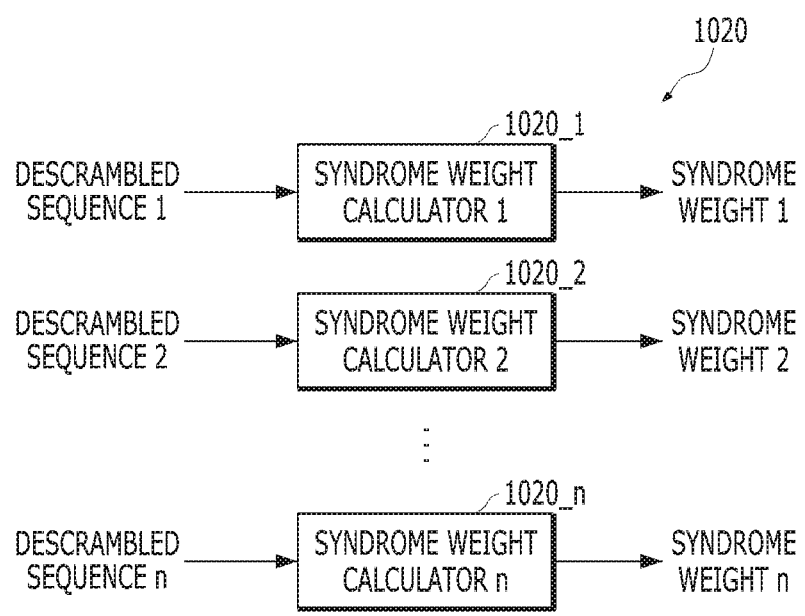
FIG. 12 is a diagram illustrating a syndrome calculator in accordance with an embodiment of the present invention.

FIG. 12 is a diagram illustrating a syndrome calculator 1020 in accordance with an embodiment of the present invention. For example, the syndrome calculator of FIG. 12 may depict the syndrome calculator 1020 shown in FIG. 10.

Referring to FIG. 12, the syndrome calculator 1020 may receive the plurality of descrambled sequences and calculate a plurality of syndrome weight values for the plurality of descrambled sequences. The syndrome calculator 1020 may include a plurality of syndrome weight calculators including a first syndrome weight calculator 1020_1 to a nth syndrome weight calculator 1020_n. The first syndrome weight calculator 1020_1 may receive the first descrambled sequence and calculate a first syndrome weight value of the first descrambled sequence. The second syndrome weight calculator 1020_2 may receive the second descrambled sequence and calculate a second syndrome weight value of the second descrambled sequence. The nth syndrome weight calculator 1020_n may receive the nth descrambled sequence and calculate a nth syndrome weight value of the nth descrambled sequence.

Referring back to FIG. 10, the selector 1030 may receive the plurality of sequences and select a descrambled sequence among the plurality of descrambled sequences. In various embodiments, the selector 1030 may select the descrambled sequence among the plurality of descrambled sequences based on their syndrome weight values.

Figure 13A:
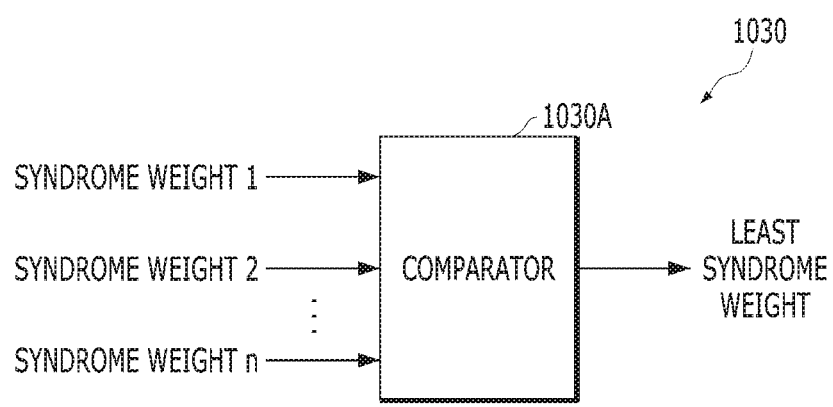
FIG. 13A is a diagram illustrating a selector in accordance with an embodiment of the present invention.

FIG. 13A is a diagram illustrating a selector 1030 in accordance with an embodiment of the present invention. For example, the selector of FIG. 13A may depict the selector 1030 shown in FIG. 10.

Referring to FIG. 13A, the selector 1030 may include a comparator 1030A. The comparator 1030A may receive a plurality of syndrome weight values in parallel, corresponding to the plurality of descrambled sequences. The comparator 1030A may sort the plurality of syndrome weight values and output the least or lowest syndrome weight value among the plurality of syndrome weight values based on the comparison results. The selector 1030 may select the descrambled sequence that has the least syndrome weight value.

Figure 13B:
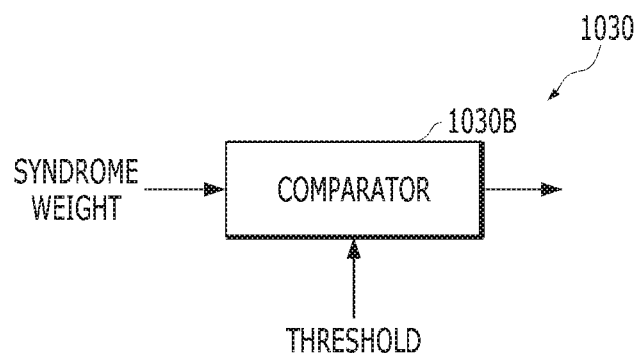
FIG. 13B is a diagram illustrating a selector in accordance with an embodiment of the present invention.

FIG. 13B is a diagram illustrating a selector 1030 in accordance with an embodiment of the present invention. For example, the selector of FIG. 13B may depict the selector 1030 shown in FIG. 10.

Referring to FIG. 13B, the selector 1030 may include a comparator 1030B. The comparator 1030B may sequentially receive a plurality of syndrome weight values, corresponding to the plurality of descrambled sequences, respectively. The comparator 1030B may compare each of the received syndrome weight values with the threshold. When the first syndrome weight value that is less than the threshold is received, the selector 1030 may select and output the descrambled sequence among the plurality of descrambled sequences, corresponding to that syndrome weight value. It is noted that the chance of an incorrect sequence having such a low syndrome weight is extremely low. Thus, the scheme of FIG. 13B may save latency and work equally well as the scheme of FIG. 13A.

Figure 14:
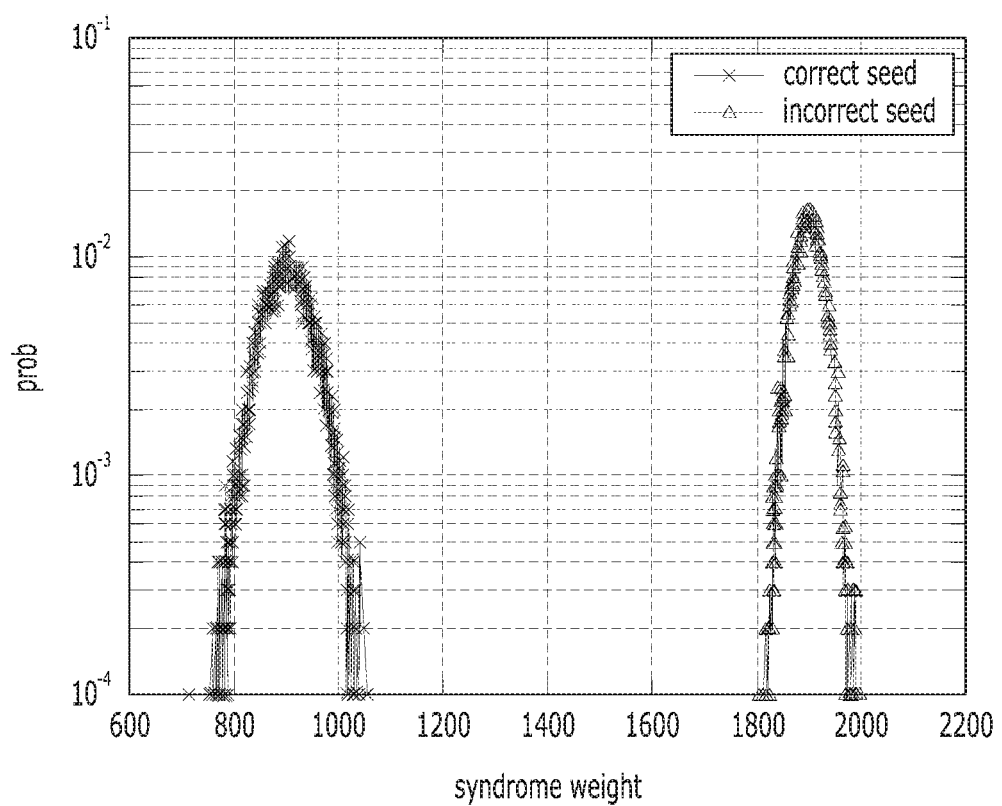
FIG. 14 is a graph illustrating a syndrome weight distribution in a decoder in accordance with an embodiment of the present invention.

FIG. 14 is a graph illustrating a syndrome weight distribution in a decoder in accordance with an embodiment of the present invention. In FIG. 14, the x-axis represents syndrome weight values and the y-axis represents a probability of seed. It is monitored that the syndrome weight value corresponding to a correct seed may be lower than the syndrome weight value corresponding to an incorrect seed.

Referring back to FIG. 10, the decoder 1040 may receive the selected descrambled sequence from the selector 1030. The decoder 1040 may decode the selected descrambled sequence and output the decoded sequence as decoded data. In various embodiments, the decoder 1040 may decode the selected descrambled sequence using a low density parity check (LDPC) code.

As described above, in the read path of the memory system, n seeds are generated based on the physical address of the data. The read data is descrambled by each of the seeds and the syndrome weight is calculated. It is noted that the syndrome calculation per codeword is about 8 ns. Accordingly, the decoder may select the correct scrambler without extra latency or area overhead, thus improving the performance of the memory system.

Although the foregoing embodiments have been illustrated and described in some detail for purposes of clarity and understanding, the present invention is not limited to the details provided. There are many alternative ways of implementing the invention, as one skilled in the art will appreciate in light of the foregoing disclosure. The disclosed embodiments are thus illustrative, not restrictive. The present invention is intended to embrace all modifications and alternatives that fall within the scope of the claims.

What is claimed is:

1. A system comprising:
   a memory device including a plurality of storage areas; and
   a decoder including:
   a seed generator configured to generate a plurality of seeds based on a physical address corresponding to a read request from a host;
   a descrambling module configured to receive a sequence from a storage area among the plurality of storage areas corresponding to the physical address, and descramble the sequence using the plurality of seeds to generate a plurality of descrambled sequences; and
   a selector configured to select a descrambled sequence among the plurality of descrambled sequences based on a plurality of syndrome weight values corresponding to the plurality of descrambled sequences.

2. The system of claim 1, wherein the decoder further includes: a plurality of syndrome weight calculators configured to receive the plurality of descrambled sequences respectively and calculate the plurality of syndrome weight values for the plurality of descrambled sequences, respectively.

3. The system of claim 2, wherein the selector selects the descrambled sequence having the least syndrome weight value among the plurality of descrambled sequences.

4. The system of claim 3, wherein the selector includes a comparator configured to receive the plurality of syndrome weight values in parallel, compare the plurality of syndrome weight values and output the selected descrambled sequence corresponding to the least syndrome weight value.

5. The system of claim 2, wherein the descrambled sequence selected by the selector has a syndrome weight value less than a threshold.

6. The system of claim 5, wherein the selector includes a comparator configured to sequentially receive the plurality of syndrome weight values, compare each of the received syndrome weight values with the threshold, identify a first syndrome weight value that is less than the threshold in the sequentially received plurality of syndrome weight values, and output the descrambled sequence corresponding to the first syndrome weight value as the selected syndrome weight value.

7. The system of claim 2, wherein the descrambling module includes a plurality of descrambling components, wherein each of the plurality of descrambling component includes:
   a random generator configured to generate a random number based on a corresponding seed among the plurality of seeds; and
   a descrambler configured to descramble the sequence using the random number to generate a corresponding descrambled sequence among the plurality of descrambled sequences.

8. The system of claim 1, further comprising:
   a decoder configured to receive the selected descrambled sequence, decode the selected descrambled sequence and output the decoded sequence as decoded data.

9. A method for operating a system, which includes a memory device including a plurality of storage areas, the method comprising:
   generating a plurality of seeds based on a physical address corresponding to a read request from a host;
   descrambling a sequence from a storage area among the plurality of storage areas corresponding to the physical address, using the plurality of seeds to generate a plurality of descrambled sequences; and
   selecting a descrambled sequence among the plurality of descrambled sequences based on a plurality of syndrome weight values corresponding to the plurality of descrambled sequences.

10. The method of claim 9, further comprising:
    calculating the plurality of syndrome weight values for the plurality of descrambled sequences, respectively.

11. The method of claim 10, wherein the selecting of the descrambled sequence comprises selecting the descrambled sequence having the least syndrome weight value among the plurality of descrambled sequences.

12. The method of claim 11, wherein the selecting of the descrambled sequence comprises:
    receiving the plurality of syndrome weight values in parallel, comparing the plurality of syndrome weight values; and
    outputting the selected descrambled sequence corresponding to the least syndrome weight value.

13. The method of claim 10, wherein the selecting of the descrambled sequence comprises selecting the descrambled sequence having a syndrome weight value less than a threshold.

14. The method of claim 13, wherein the selecting of the descrambled sequence comprises:
    sequentially receiving the plurality of syndrome weight values;
    comparing the received syndrome weight value with the threshold;
    identifying a first syndrome weight value that is less than the threshold in the sequentially received plurality of syndrome weight values; and
    outputting the descrambled sequence corresponding to the first syndrome weight value as the selected syndrome weight value.

15. The method of claim 10, wherein the descrambling of the sequence comprises:
    generating a random number based on a corresponding seed among the plurality of seeds; and
    descrambling the sequence using the random number to generate a corresponding descrambled sequence among the plurality of descrambled sequences.

16. The method of claim 9, further comprising:
    decoding the selected descrambled sequence and outputting the decoded sequence as decoded data.

* * * * *